(12) United States Patent
Huang et al.

(10) Patent No.: US 8,304,830 B2
(45) Date of Patent: Nov. 6, 2012

(54) LDPMOS STRUCTURE FOR ENHANCING BREAKDOWN VOLTAGE AND SPECIFIC ON RESISTANCE IN BICMOS-DMOS PROCESS

(75) Inventors: Yin-Fu Huang, Tainan (TW); Miao-Chun Chung, Toufen Township, Miaoli County (TW); Shih-Chin Lien, Sinjhuang (TW)

(73) Assignee: Macronix International Co., Ltd., Hsinchu (TW)

( * ) Notice: Subject to any disclaimer, the term of this patent is extended or adjusted under 35 U.S.C. 154(b) by 236 days.

(21) Appl. No.: 12/797,896

(22) Filed: Jun. 10, 2010

(65) Prior Publication Data

US 2011/0303977 A1  Dec. 15, 2011

(51) Int. Cl.
*H01L 29/772* (2006.01)

(52) U.S. Cl. ......... 257/339; 257/E29.261; 257/E21.417; 438/286

(58) Field of Classification Search .................. None
See application file for complete search history.

(56) References Cited

U.S. PATENT DOCUMENTS 6,207,484 B1 * 3/2001 Kim et al. ............... 438/209
2008/0283914 A1 * 11/2008 Fujii ........................ 257/341

* cited by examiner

*Primary Examiner* — Fei Fei Yeung Lopez
(74) *Attorney, Agent, or Firm* — Stout, Uxa, Buyan & Mullins, LLP

(57) ABSTRACT

An LDPMOS structure having enhanced breakdown voltage and specific on-resistance is described, as is a method for fabricating the structure. A P-field implanted layer formed in a drift region of the structure and surrounding a lightly doped drain region effectively increases breakdown voltage while maintaining a relatively low specific on-resistance.

7 Claims, 9 Drawing Sheets

ated in the accompanying drawings, instances of which are to be interpreted to be to scale in some implementations while in other implementations, for each instance, not. In certain

LDPMOS STRUCTURE FOR ENHANCING BREAKDOWN VOLTAGE AND SPECIFIC ON RESISTANCE IN BICMOS-DMOS PROCESS

BACKGROUND OF THE INVENTION

1. Field of the Invention

The present invention relates generally to semiconductors and, more particularly, to power metal-oxide-semiconductor transistors and methods of fabricating and using same.

2. Description of Related Art

A lateral double-diffused metal-oxide-semiconductor (LDMOS) field effect transistor (MOSFET) is a MOSFET fabricated with coplanar drain and source regions. LDMOS devices with a P-channel may be referred to as LDPMOS devices. These devices are typically used in high voltage applications. When designing such LDPMOS devices, it is important for the device to have a very high breakdown voltage (BVD) whilst also exhibiting, during operation, a low specific on-resistance ($R_{onsp}$). By designing LDPMOS devices with low $R_{onsp}$ and high BVD, low power loss can be achieved in high voltage applications. In addition, a low $R_{onsp}$ can facilitate a high drain current ($I_{dsat}$) when the transistor is in saturation. One problem encountered when designing such LDPMOS devices is that approaches tending to maximize BVD tend also adversely to affect the $R_{onsp}$ and vice versa. In other words, a trade-off (e.g., inverse relationship) is typically presented between the optimization of BVD and $R_{onsp}$.

A need thus exists in the prior art for a lateral power MOSFET arrangement that can provide an effective compromise between large BVD and small $R_{onsp}$.

SUMMARY OF THE INVENTION

The present invention addresses this need by providing a semiconductor structure that exhibits an efficient trade-off between breakdown voltage (BVD) and specific on-resistance ($R_{onsp}$). The invention herein disclosed comprises, according to one embodiment, a substrate formed of a first conductivity type with an epitaxial layer formed over the substrate. A first well region of a second conductivity type may be formed in the epitaxial layer with a second well region of the second conductivity type likewise formed in the epitaxial layer and spaced apart from the first well region. A third well region of the first conductivity type may be formed between the first well region and the second well region. A field region of the first conductivity type may be formed in a surface of the third well region and spaced apart from the first and second well regions, the field region having a drain region of the first conductivity type formed on a surface thereof and extending into the field region.

Another embodiment of the present invention further comprises a buried region of the second conductivity type formed in the epitaxial layer and extending into the substrate. According to this embodiment, the first well region extends from a surface of the epitaxial layer to an upper extent (e.g., surface) of the buried region, the first well region overlying a portion of the buried region and extending laterally beyond (e.g., past a right extent of) the buried region. The second well region of this embodiment also extends from the surface of the epitaxial layer to the upper extent of the buried region, overlies a portion of the buried region, and extends laterally beyond (e.g., past a left extent of) the buried region. The field region is spaced apart from the buried region.

While the apparatus and method has or will be described for the sake of grammatical fluidity with functional explanations, it is to be expressly understood that the claims, unless indicated otherwise, are not to be construed as limited in any way by the construction of "means" or "steps" limitations, but are to be accorded the full scope of the meaning and equivalents of the definition provided by the claims under the judicial doctrine of equivalents.

Any feature or combination of features described or referenced herein are included within the scope of the present invention provided that the features included in any such combination are not mutually inconsistent as will be apparent from the context, this specification, and the knowledge of one skilled in the art. In addition, any feature or combination of features described or referenced may be specifically excluded from any embodiment of the present invention. For purposes of summarizing the present invention, certain aspects, advantages and novel features of the present invention are described or referenced. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE PRESENTLY PREFERRED EMBODIMENTS

Figure 1:
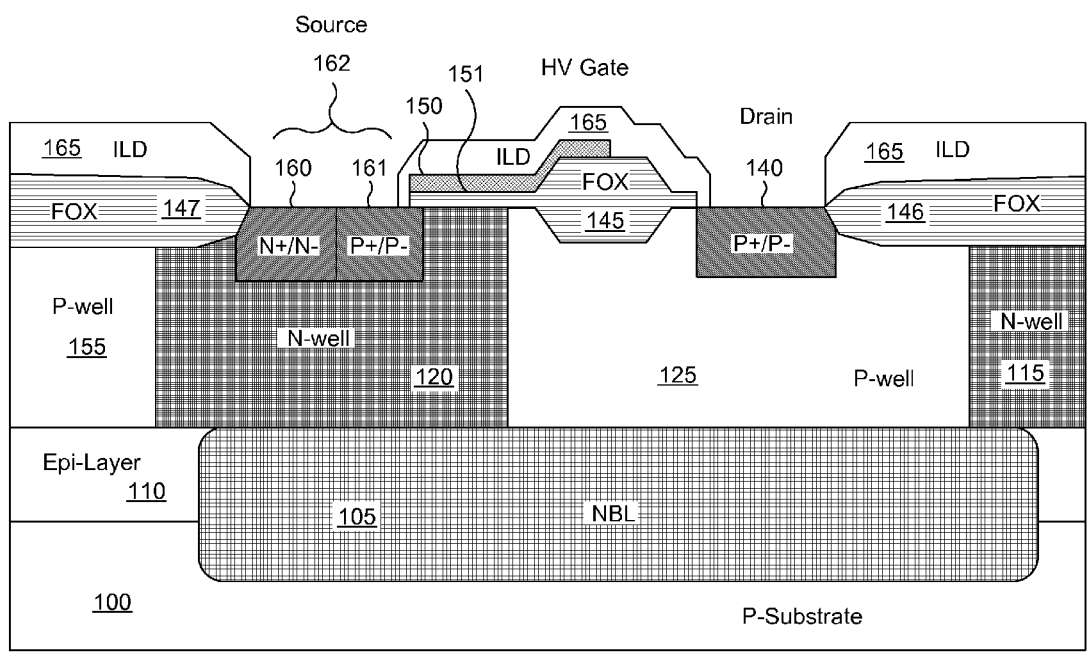
FIG. 1 is a cross-sectional view of a first example of a prior-art lateral double-diffused P-channel metal-oxide-semiconductor (LDPMOS) structure.

Embodiments of the invention are now described and illustrated in the accompanying drawings, instances of which are to be interpreted to be to scale in some implementations while in other implementations, for each instance, not. In certain aspects, use of like or the same reference designators in the drawings and description refers to the same, similar or analogous components and/or elements, while according to other implementations the same use should not. According to certain implementations, use of directional terms, such as, top, bottom, left, right, up, down, over, above, below, beneath, rear, and front, are to be construed literally, while in other implementations the same use should not. The present invention may be practiced in conjunction with various integrated circuit fabrication and other techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to lateral double-diffused metal-oxide-semiconductor field effect transistors (MOSFETs) and related methods of use and manufacture.

Figure 2:
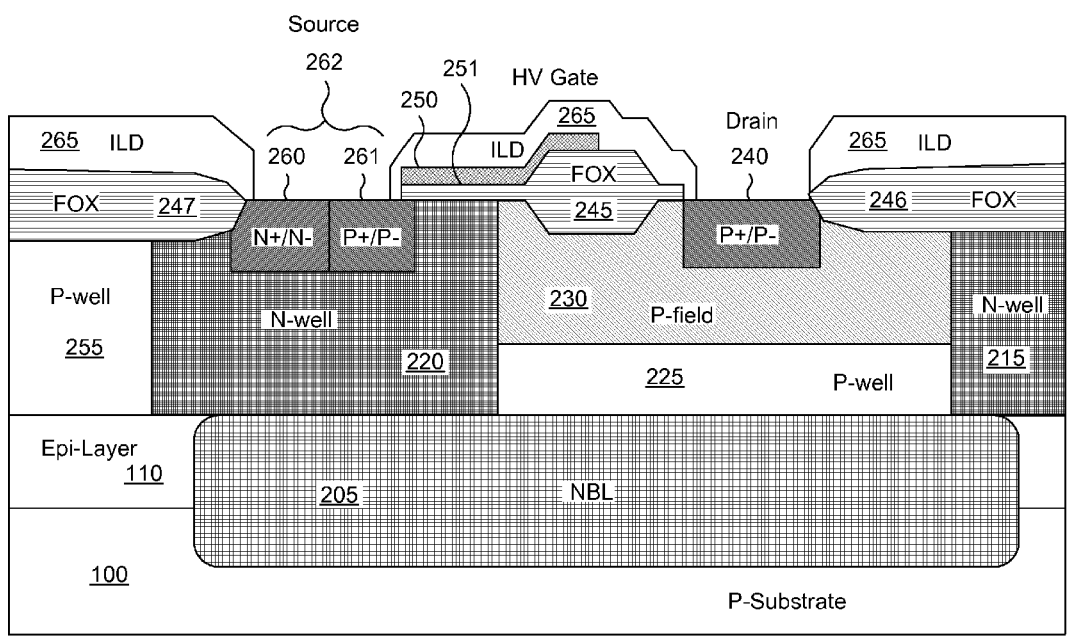
FIG. 2 is a cross-sectional view of a second example of a prior-art LDPMOS structure.

Referring more particularly to the drawings, FIGS. 1 and 2 are cross-sectional diagrams of prior-art lateral double-diffused P-channel metal-oxide-semiconductor (LDPMOS) field effect transistors. A relatively good breakdown voltage (BVD) is obtained in FIG. 1, at the expense of an unacceptably large specific on-resistance ($R_{onsp}$). On the other hand, when an improvement is made to $R_{onsp}$ as in FIG. 2, it tends to be at the expense of a smaller BVD.

Figure 3:
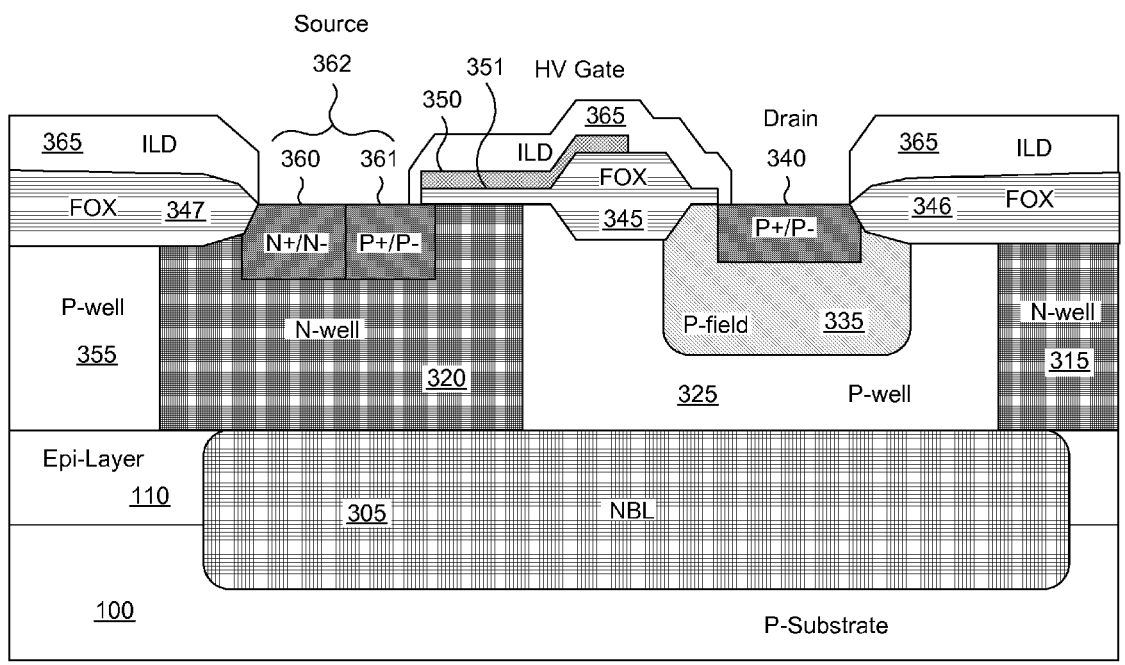
FIG. 3 is a cross-sectional view of an LDPMOS structure fabricated according to the present invention.

A device illustrated FIG. 3, according to the embodiment of the present invention, comprises a P-type substrate 100 in which is formed an N-type buried layer (NBL) 305. A P-type epitaxial layer 110 overlies the substrate 100 and NBL 305, the epitaxial layer 110 having first and second N-wells 315 and 320 formed therein. A first P-well 325 is disposed between the first and second N-wells 315 and 320, and a second P-well 355 is disposed adjacent the second N-well 320 and opposite the first P-well 325. A P-field 335, which may be referred to as a P-field region, is formed (e.g., implanted) in the first P-well 325, the P-field 335 occupying a portion of a drift region of the LDPMOS device. The P-field 335 may be spaced apart from the first N-well 315, the second N-well 320, and the NBL 305. Respective first, second, and third field oxide (FOX) regions 345, 346, and 347 overlie first and second N-wells 315 and 320 and the first and second P-wells 325 and 355, the first and second FOX regions 345 and 346 being separated, as are the first and third FOX regions 345 and 347. The first FOX region 345 overlies a left portion of the P-field 335, and the second FOX region 346 overlies a right portion of the P-field 335 in order to reduce drift region resistance and increase breakdown voltage. A P+/P– lightly doped drain region (PLDD) 340 is formed in a surface of the P-field 335 between the first and second FOX regions 345 and 346. A source region 362 comprising an N+/N– region 360 abutted with a P+/P– region 361 is formed in the second N-well 320. A high-voltage gate terminal 365 overlies a portion of the first FOX region 345 as well as a portion of the second N-well 320. An interlayer dielectric 365 overlies all portions of the resulting structure except for the drain and source regions.

A typical embodiment of the structure just described exhibits a specific on-resistance ($R_{onsp}$) ranging from about 50 to 150, an example being, 95, mΩ-mm² while maintaining a breakdown voltage (BVD) of about –25 to –45, an example being –35, volts. As such, the present invention may be noted to provide an efficient trade-off between BVD and $R_{onsp}$.

The characteristics of the embodiment of FIG. 3 may be contrasted with the prior-art LDPMOS device of FIG. 1. That illustrated prior-art device, while including features similar and/or analogous to those in the LDPMOS structure described above with reference to FIG. 3, does not contain a P-field. As mentioned above, although the prior-art device of FIG. 1 is known to exhibit relatively good breakdown voltage (BVD) performance, it presents an unacceptably large value of specific on-resistance, $R_{onsp}$. For example, a typical such device having a BVD of about –35 V presents an $R_{onsp}$ of about 160 mΩ-mm².

As an attempt to improve $R_{onsp}$ properties of the prior-art device of FIG. 1, the structure of FIG. 2 is formed similar to that of FIG. 1 with mostly corresponding elements except that a P-field 230 is formed in a first P-well 225. The first P-well 225 may correspond to the first P-well 125 in FIG. 1 with the P-field 230 extending from a first N-well 215 to a second N-well 220. To the extent that addition of the P-field 230 to the structure of FIG. 1 improves the $R_{onsp}$ of the device, the improvement is obtained at an expense of a smaller BVD. That is, while the $R_{onsp}$ may be improved from about 160 to about 80 mΩ-mm² vis-à-vis that of the prior-art device of FIG. 1, the BVD undesirably decreases from about –35 V to about –27 V.

Returning to FIG. 3, it may be noted that the P-field 335, which surrounds the drain region 340 and is spaced apart from the NBL 305, the first N-well 315, and the second N-well 320, distinguishes, owing at least to such structure, the present invention from either of the prior-art examples described above with reference to FIGS. 1 and 2.

It will be understood by one skilled in the art that respective references to N- and P-type materials, implantations, depositions, and so on may be replaced, respectively, by P- and N-type references. That is, N- and P-type references may be interchanged throughout this disclosure, which then may describe an LDNMOS, rather than LDPMOS structure. The description of an LDPMOS structure, for at least this reason, as an example is not intended to limit the scope of the present invention.

Figure 4:
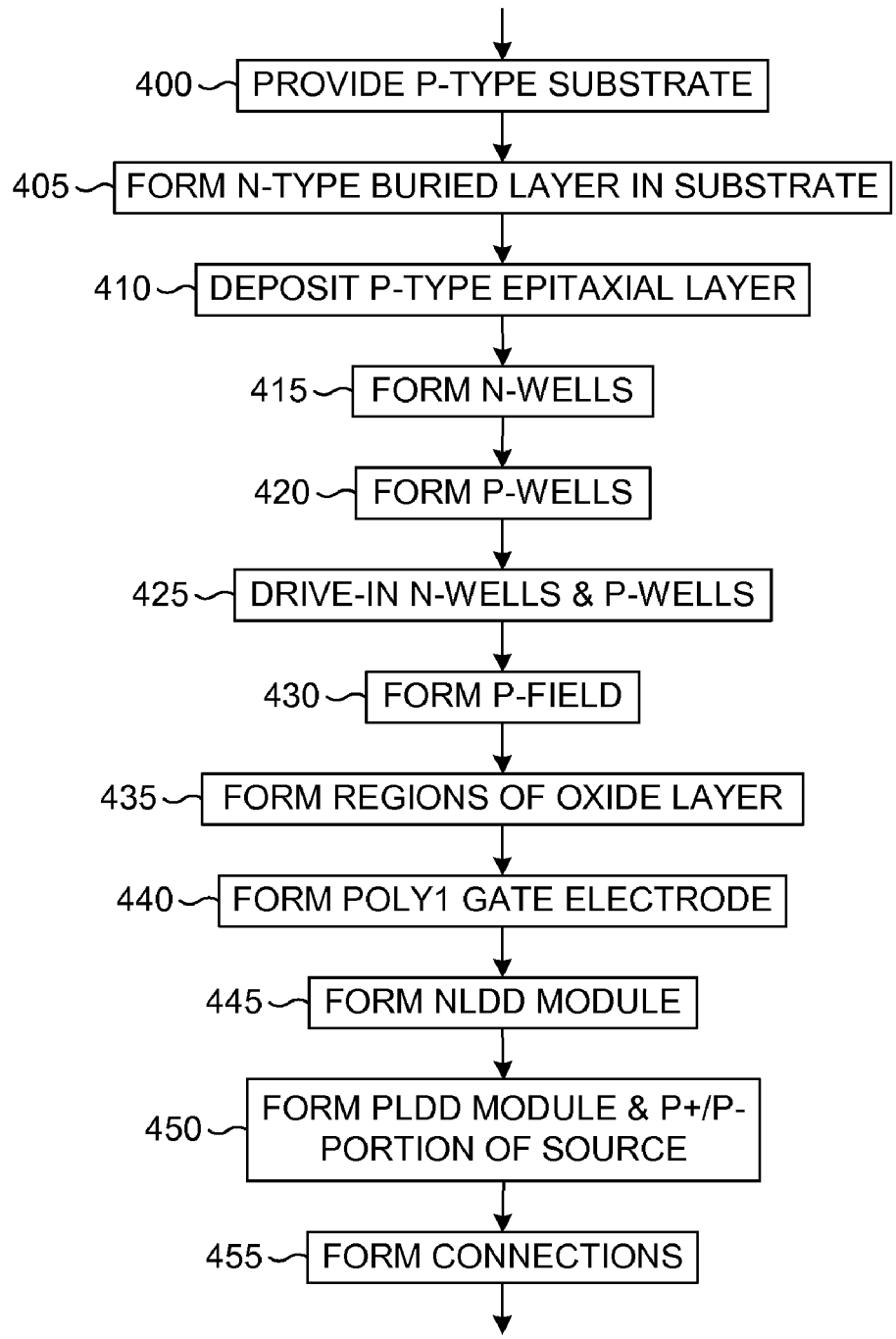
FIG. 4 is a flow diagram illustrating an implementation of a method of fabricating an LDPMOS structure according to the present invention.

FIG. 4 is a flow diagram that summarizes an implementation of a method comprising manufacturing steps that may be performed in order to fabricate an LDPMOS structure such as that illustrated in FIG. 3, and FIGS. 5A-5I. Of these, FIGS. 5A-5I illustrate, in addition to an LDPMOS structure fabricated according to the present invention, a conventional NMOS transistor, an NPN bipolar junction transistor (BJT), and two prior-art LDPMOS transistors, the latter having been described above with reference to FIGS. 1 and 2. All of the aforementioned structures may be fabricated by a known biCMOS-DMOS (BCD) process. FIGS. 5A-5I, therefore, illustrate that the present invention may readily be practiced within the scope of known BCD methods.

With combined reference to FIGS. 3, 4 and 5A-5I, the illustrated method includes providing the P-type substrate 100 at step 400 followed by formation of NBL 305 (FIGS. 3 and 5A) therein at step 405 using, for example, a photolithographic method. For instance, a patterned photoresist layer may be formed using a mask on the substrate 100, the photoresist layer exposing regions to be implanted. Atoms of an N-type dopant (e.g., antimony, arsenic or phosphorous) may then be implanted into the exposed portions of the substrate 100 at a concentration of about $10^{13}$ to $10^{15}$, an example being $5 \times 10^{14}$, atoms/cm². Afterward, the photoresist may be removed, and a drive-in procedure may be performed to drive the N-type atoms to a desired depth of about 2 to 4, an example being 3, microns. The drive-in procedure may comprise applying a high temperature (e.g., from about 1100 to about 1300, an example being 1200, degrees C.) for an extended time (e.g., about 2 to about 10, an example being 6, hours). The P-type epitaxial layer 110 (FIGS. 3 and 5B) may then be deposited on the structure of FIG. 5A at step 410.

According to a typical embodiment, the epitaxial layer 110 has a thickness ranging from about 3.5 to about 5.5, an example being 4.5, microns.

First and second N-wells 315 and 320 (FIGS. 3 and 5C) may be formed in the epitaxial layer 110 at step 415, using, for example, a photolithographic method similar to that already described and/or that is well understood, to implant the N-wells 315 and 320 with atoms of N-type material at a concentration of about $10^{12}$ to $10^{13}$, an example being $9\times10^{12}$, atoms/$cm^2$. According to one embodiment, the first N-well 315 has a width of about 1.5 to about 3.5, an example being 2.5, microns and extends partially over (e.g., contacting) a first part (e.g., edge) of the NBL 305. The second N-well 320 may have a width of about 4 to about 6, an example being 5, microns extending partially over (e.g., contacting) another part (e.g., opposing part or end) of the NBL 305. At step 420, first and second P-wells 325 and 355 may be formed in the epitaxial layer 110, the first P-well 325 being formed between the first and second N-wells 315 and 320, the second P-well 355 being formed adjacent the second N-well 320 opposite the first P-well 325. Forming of the first and second P-wells 325 and 355 may include patterning/implanting regions corresponding to their footprints (e.g., the space between N-wells 315 and 320 and that adjacent the second N-well 320) with atoms of P-type material (e.g., boron) at a concentration of about $10^{12}$ to $10^{13}$, an example being $8\times10^{12}$, atoms/$cm^2$. A suitable drive-in procedure may be performed at step 425 to drive-in the N- and P-wells 315, 320, 325, and 355 to a depth about the same as that of an upper extent of the NBL 305, which can be about 2 to 4, an example being 3, microns.

At step 430, the P-field 335 (FIGS. 3 and 5D) may be formed in the P-well 325 by patterning a portion of a surface of the P-well 325 and implanting atoms of P-type material at a concentration of about $10^{12}$ to $10^{13}$, an example being $1\times10^{13}$, atoms/$cm^2$. In the illustrated embodiment, once formed, opposing sides (e.g., first and second extents) of the P-field 335 may be separated (i.e., by corresponding portions of the P-well 325) from, respectively, the second N-well 320 and the first N-well 315 by about 0.3 to 1.2, an example being 0.7, microns. A drive-in procedure then may drive the P-field 335 to a depth of about 0.2 to 0.6, an example being 0.4, microns corresponding to a separation of the P-field 335 from the NBL 305 by a distance of about 3.4 to 3.6, an example being 3.2, microns.

Figure 5A:
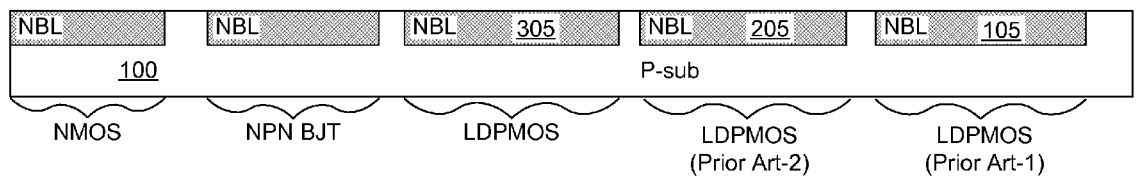
FIG. 5A is a cross-sectional diagram illustrating an early stage of fabricating a collection of semiconductor structures after implanting an N-type buried layer into a P-type substrate.
Figure 5B:
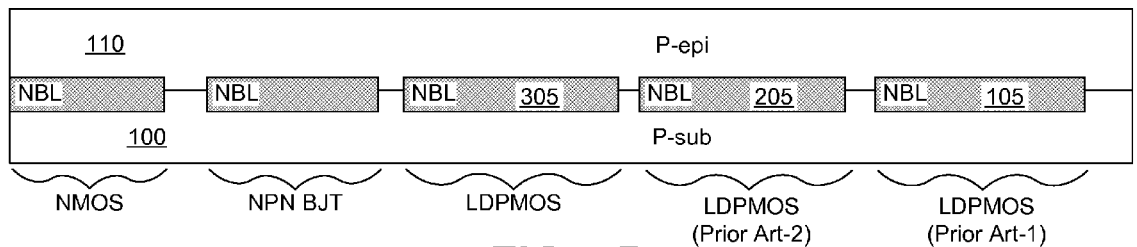
FIG. 5B is a cross-sectional diagram illustrating a result of depositing a P-type epitaxial layer over the structure of FIG. 5A.
Figure 5C:
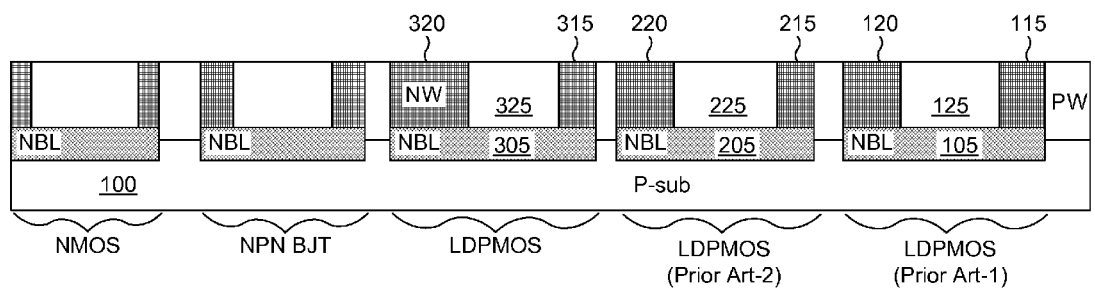
FIG. 5C is a cross-sectional diagram portraying an effect of forming N- and P-wells in the structure of FIG. 5B.
Figure 5D:
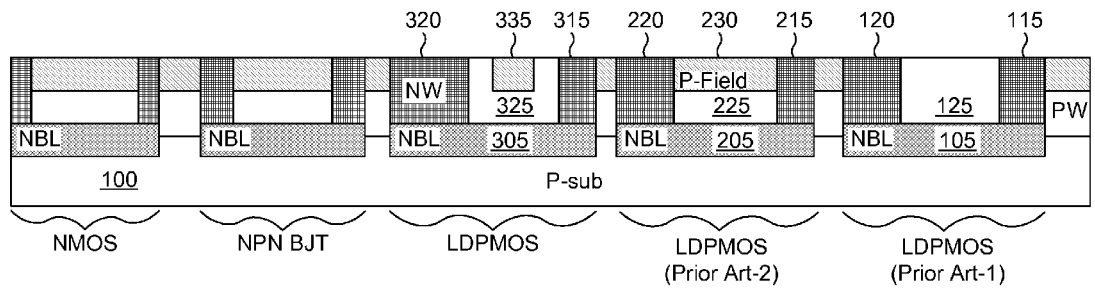
FIG. 5D is a cross-sectional diagram showing a result of forming a P-field in a portion of the structure of FIG. 5C.
Figure 5E:
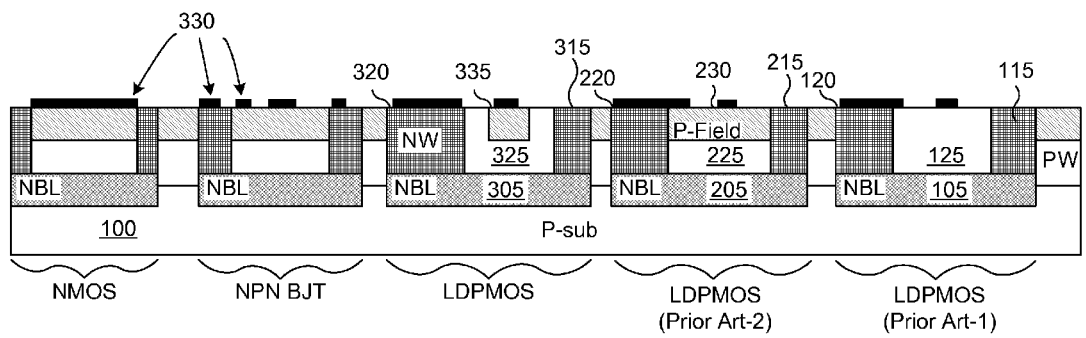
FIG. 5E is a cross-sectional diagram of the structure of FIG. 5D having a surface patterned with a layer of SiN.
Figure 5F:
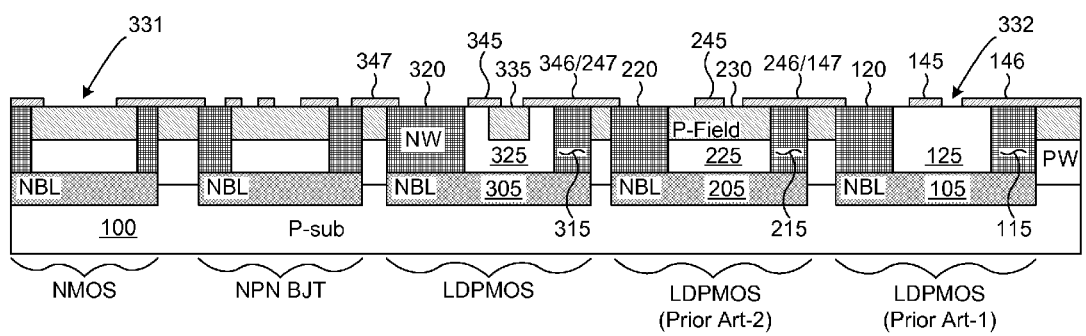
FIG. 5F is a cross-sectional diagram of the structure of FIG. 5D after formation of field oxide (FOX) regions on a surface thereof.
Figure 5G:
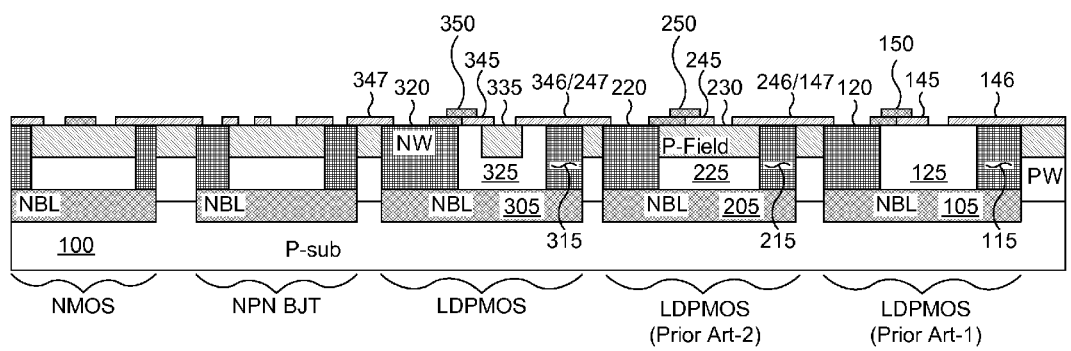
FIG. 5G is a cross-sectional diagram illustrating a result of formation of high-voltage gate structures on the structure of FIG. 5F.

Field oxide (FOX) regions 345, 346, and 347 (FIGS. 3 and 5F) may then be formed on the structure of FIG. 5D at step 435. For example, an oxide layer may be grown over (e.g., on the surface of) the structure of FIG. 5D, followed by patterning and etching the oxide layer to expose active areas (e.g., source 362 and drain 340 regions, cf. FIGS. 3 and 5H). Alternatively, the field oxide regions may be formed by a process of local oxidation of silicon (LOCOS), which may facilitate isolation of adjacent transistors. For example, a patterned layer 330 of SiN may be deposited on the surface of the structure of FIG. 5D with the layer 330 exposing regions on which FOX is to be formed as illustrated in FIG. 5E, followed by the LOCOS process oxidizing the exposed regions and the SiN layer then being removed to expose the active areas.

A portion of the first FOX region 345 may include a thin region 351 (FIG. 3) overlying a portion of the second N-well 320. The oxidation step may include sacrificial oxide oxidation (SAC OX), thick gate oxide oxidation (THICK GOX) 332 and low-voltage gate oxide oxidation (LV GOX) 331 in FIG. 5F. Low-voltage areas may be patterned, implanted and etched using known methods.

A gate electrode 350 (FIGS. 3 and 5G) may be formed at step 440 to overlie a portion of the FOX 345 including the thin region 351 above a portion of the source 362, a portion of the second N-well 320, and a portion of the first P-well 325. The gate electrode 350, which may comprise, for example, polysilicon material, may be formed by depositing polysilicon over the structure of FIG. 5F and then patterning and etching to form the gate electrode 350.

Figure 5H:
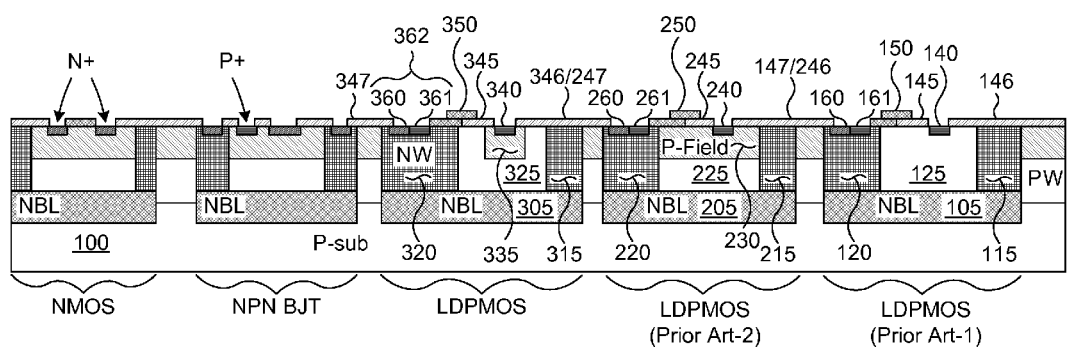
FIG. 5H is a cross-sectional diagram that demonstrates a result of performing P- and N-type implantations on the structure of FIG. 5G.
Figure 5I:
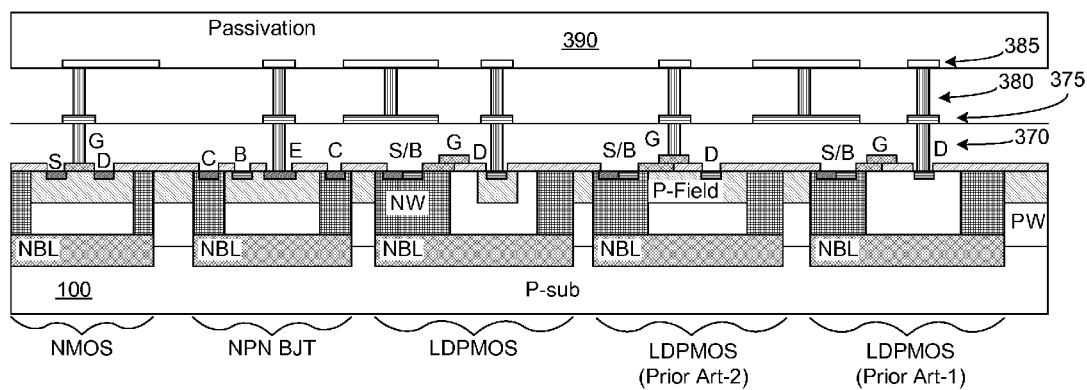
FIG. 5I is a cross-sectional diagram showing metal layers, vias, and a passivation layer applied to the structure of FIG. 5H.

At step 445, the N+/N− region 360 (i.e., an N-type lightly-doped drain [NLDD] module) may be formed by implanting N-type atoms into a surface of a first portion of a space between the first and third FOX regions 345 and 347 (e.g., and contacting third FOX region 347). A first portion of the N+/N− region 360 may be lightly doped (N−), with a second portion being doped to a higher concentration of N-type atoms (N+). For example, the (N−) portion may be doped to a concentration of about $10^{13}$ to $10^{14}$, an example being $3\times10^{13}$, atoms/$cm^2$, while the (N+) portion may be doped to a concentration of about $10^{15}$ to $10^{16}$, an example being $3\times10^{15}$, atoms/$cm^2$. At step 450, the PLDD 340 may be formed by implanting atoms of P-type material between (e.g., and contacting) the first and second FOX regions 345 and 346 as shown in FIGS. 3 and 5H. At the same time, atoms of P-type material maybe implanted in the P+/P− region 361 of the source 362 formed in a second portion of the space between the first and third FOX regions 345 and 347 (e.g., and contacting first FOX region 345). Portions of the drain 340 and P+/P− region 361 may be lightly doped (P−) while other portions of the drain 340 and P+/P− region 361 may be implanted with atoms of P-type material at a higher concentration (P+). As one example, the (P−) regions may be doped to a concentration of about $10^{12}$ to $10^{13}$, an example being $7\times10^{12}$, atoms/$cm^2$, and the (P+) regions may be doped to a concentration of about $10^{15}$ to $10^{16}$, an example being $3\times10^{15}$, atoms/$cm^2$. At step 455, application-dependent connections to the structure formed in the previous steps may be formed using methods known in the art. For example, a plurality of vias 370 and 380 (FIG. 5I) may provide connections between elements such as a drain D (i.e., 340 in FIG. 5H) and first and second metal layers 375 and 385. A passivation layer 390 may overlie the resulting structure.

Although the disclosure herein refers to certain illustrated embodiments, it is to be understood that these embodiments have been presented by way of example rather than limitation. The intent accompanying this disclosure is to have such embodiments construed in conjunction with the knowledge of one skilled in the art to cover all modifications, variations, combinations, permutations, omissions, substitutions, alternatives, and equivalents of the embodiments, to the extent not mutually exclusive, as may fall within the spirit and scope of the invention as limited only by the appended claims.

What is claimed is:

1. A semiconductor structure comprising: a substrate formed of a first conductivity type; an epitaxial layer formed over the substrate; a first well region of a second conductivity type formed in the epitaxial layer; a second well region of the second conductivity type formed in the epitaxial layer and spaced apart from the first well region; a third well region of the first conductivity type formed between the first well region and the second well region; a field region of the first conductivity type formed in a surface of the third well region and spaced apart from the first well region and the second well region; and a drain region of the first conductivity type formed in a surface of and extending into the field region; a buried region of the second conductivity type formed in the epitaxial layer and extending into the substrate, wherein: the first well region extends from a surface of the epitaxial layer to an upper extent of the buried region, the first well region overlying a portion of the buried region and extending laterally beyond the buried region; the second well region extends from the surface of the epitaxial layer to the upper extent of the buried region, the second well region overlying a portion of the buried region and extending laterally beyond the buried region;

and the field region is spaced apart from the buried region; a first insulation region overlying a portion of the second well region, a portion of the third well, and a portion of the field region; and a gate electrode formed on the first insulation region above the portion of the second well region and extending over a portion of the third well region.

2. The semiconductor structure as set forth in claim 1, wherein:

the first conductivity type is P-type; and
the second conductivity type is N-type.

3. The semiconductor structure as set forth in claim 1, wherein:

the first conductivity type is N-type; and
the second conductivity type is P-type.

4. The semiconductor structure as set forth in claim 1, further comprising a source region formed in a surface of and extending into the second well region.

5. The semiconductor structure as set forth in claim 4, wherein the source region comprises:

a first portion of the second conductivity type; and
a second portion of the first conductivity type, the second portion abutting the first portion.

6. The semiconductor structure as set forth in claim 1, further comprising: a second insulation region overlying and extending into the first well region, a portion of the third well region, and a portion of the field region, the second insulation region extending to the drain region; a fourth well region of the first conductivity type adjacent to the second well region opposite the third well region; and a third insulation region overlying and extending into the fourth well region and a portion of the second well region, the third insulation region also extending to the source region.

7. The semiconductor structure as set forth in claim 6, wherein the insulation regions comprise field oxide.

* * * * *